United States Patent [19]
Hazama et al.

[11] Patent Number: 5,162,880
[45] Date of Patent: Nov. 10, 1992

[54] NONVOLATILE MEMORY CELL HAVING GATE INSULATION FILM WITH CARRIER TRAPS THEREIN

[75] Inventors: Hiroaki Hazama, Kanagawa; Kazumi Nishinohara, Tokyo, both of Japan

[73] Assignee: Kabushiki Kaisha Toshiba, Kawasaki, Japan

[21] Appl. No.: 589,436

[22] Filed: Sep. 27, 1990

[30] Foreign Application Priority Data

Sep. 27, 1989 [JP] Japan .................................. 1-249311
Sep. 14, 1990 [JP] Japan .................................. 2-242509

[51] Int. Cl.⁵ ..................... H01L 29/68; H01L 29/34; G11C 11/34
[52] U.S. Cl. .................................. 257/106; 365/185; 257/367; 257/314
[58] Field of Search ................... 357/23.5, 54; 365/185

[56] References Cited

U.S. PATENT DOCUMENTS 3,805,130 4/1974 Yamazaki .......................... 357/23.5
4,047,974 9/1977 Harari ................................. 357/54
4,173,791 11/1979 Bell ................................. 357/23.5

Primary Examiner—William Mintel
Assistant Examiner—Robert Limanek
Attorney, Agent, or Firm—Foley & Lardner

[57] ABSTRACT

A nonvolatile memory cell comprises a semiconductor substrate of first conduction type, a high-concentration impurity region of second conduction type formed on the semiconductor substrate and connected to a bit line, an insulation film in which carrier traps are formed, and a gate electrode that is opposite the high-concentration impurity region across the insulation film and connected to a word line. Carriers are captured by, and released from, the carrier traps formed in the insulation film, in response to bias voltages applied to the word and bit lines. Information stored in the memory cell depends on whether or not the carrier traps are holding carriers. The information is read out of the memory cell as the difference of a tunneling current flowing between the semiconductor substrate and the high-concentration impurity region.

5 Claims, 14 Drawing Sheets

ERASE

WRITE

FIG.16a WRITE (CARRIER INJECTION)
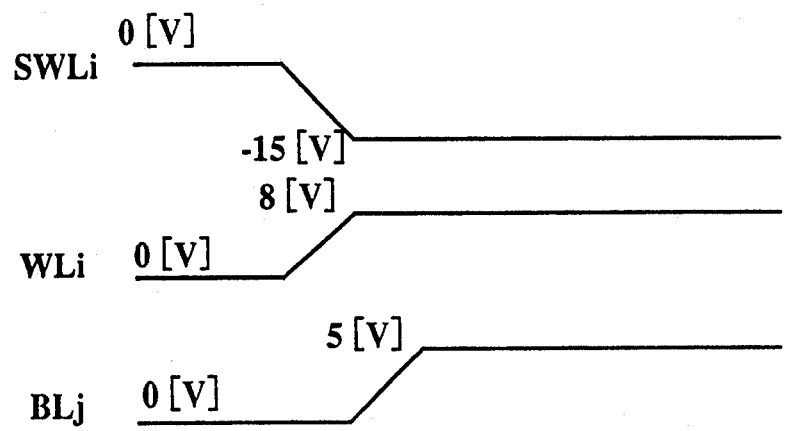
FIG.16b ERASE
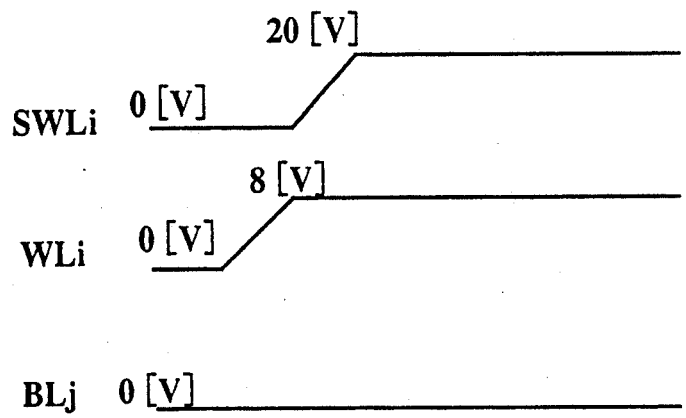
FIG.16c READ
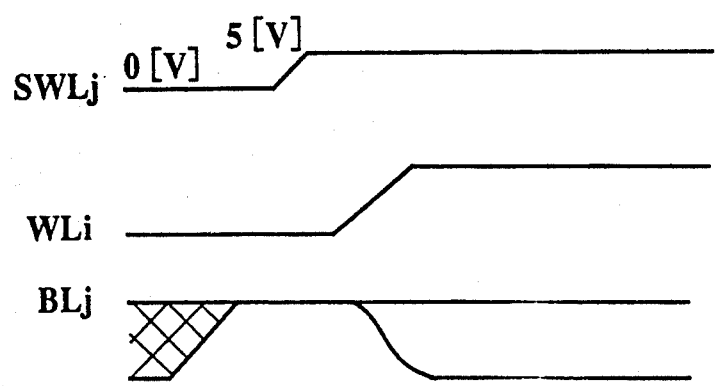

NONVOLATILE MEMORY CELL HAVING GATE INSULATION FILM WITH CARRIER TRAPS THEREIN

BACKGROUND OF THE INVENTION

1. Field of the Invention

The present invention relates to a nonvolatile memory cell that is capable of being electrically written, read and erased, depending on carriers captured by or released from carrier traps formed in a gate insulation film of the memory cell. It also relates to a method of manufacturing such a nonvolatile memory cell.

2. Description of the Prior Art

A known nonvolatile memory device capable of being electrically written, read and erased is an EEPROM.

FIGS. 1a and 1b show a memory cell comprising an EEPROM transistor, having a floating gate. To erase the contents of the memory cell in FIG. 1a, a bias voltage of about, for example, 20 V is applied to a control gate 4 and a bias voltage of about 0 V to a drain region 2 formed on a semiconductor substrate 1, thereby injecting electrons from the drain region 2 into a floating gate 3.

To write the memory cell in FIG. 1b, a bias voltage of about 0 V is applied to the control gate 4 and a bias voltage of about 20 V to the drain region 2, thereby releasing electrons from the floating gate 3 toward the drain region 2.

FIG. 2 shows a memory device comprising a matrixed array of memory cells each including only the above-mentioned transistor.

To write a cell 1 in FIG. 2, a bias voltage of about 0 V is applied to a word line WL1 and a bias voltage of about 20 V to a bit line BL1, thereby establishing a write state of the cell 1.

Due to the bias voltage of about 20 V on the bit line BL1, a cell 3 will be written if a bias voltage of about 0 V is applied to a word line WL2. To avoid this, a bias voltage of about 20 V is applied to the word line WL2. Also, due to the bias voltage of about 0 V on the word line WL1, a cell 2 will be written if a bias voltage of about 20 V is applied to a bit line BL2. To avoid this, a bias voltage of about 0 V is applied to the bit line BL2.

With the word line WL1 being provided with 0 V, word line WL2 with 20 V, bit line BL1 with 20 V and bit line BL2 with 0 V, a cell 4 receives the bias voltage of about 0 V through its drain region and the bias voltage of about 20 V through its control gate, as shown in FIG. 1a. As a result, the cell 4 will be erased to lose information stored therein.

In this way, if each memory cell includes only the transistor of FIG. 1, the memory cells may interact with one another. It is then impossible to select only one of the memory cells to write or erase the one.

To prevent such interactions of memory cells, "Proc. of the 4th on Solid State Devices, Tokyo, 1972" (p. 158) by Iizuka et al. discloses a structure of FIG. 3. According to this, each memory cell comprises a transistor 5 with a floating gate, and a transfer transistor 6. The transistors 5 and 6 are connected in series between a bit line and a ground. By controlling the transfer transistor 6, it is possible to select only one memory cell to write or erase the one.

The structure of FIG. 3, however, needs two transistors for each memory cell.

As explained above, the electrically writable and erasable nonvolatile memory cells each have a single transistor with a floating gate interacting with one another, so that it is impossible to select and write or erase each of the cells.

On the other hand, the arrangement of transfer transistors requires two elements for each memory cell, thereby increasing the area of each cell, to hinder high integration.

In addition, the nonvolatile memory cell having the floating gate requires complicated manufacturing processes compared with a normal MOSFET, due to the floating gate. This increases manufacturing costs.

SUMMARY OF THE INVENTION

To solve these problems, an object of the present invention is to provide a novel nonvolatile memory cell that is capable of being electrically written, read and erased according to carriers captured by or released from carrier traps formed in a gate insulation film of the memory cell, and a method of manufacturing of such a nonvolatile memory cell.

Another object of the present invention is to provide an array of nonvolatile memory cells capable of being selectively written, read and erased, occupying a small area for the sake of high integration, and being simple to manufacture.

In order to accomplish the objects, the present invention provides a nonvolatile memory cell comprising a semiconductor substrate of first conduction type, a high-concentration impurity region of second conduction type formed on the semiconductor substrate and connected to a bit line, an insulation film in which carrier traps are formed, and a gate electrode that is opposite the high-concentration impurity region across the insulation film and connected to a word line. Carriers are captured by, and released from, the carrier traps formed in the insulation film, in response to bias voltages applied to the word and bit lines. Information stored in the memory cell depends on whether or not the carrier traps are holding carriers, and the information is read out of the memory cell as the difference of a tunneling current flowing between the semiconductor substrate and the high-concentration impurity region.

According to this arrangement, the amount of tunneling current flowing between the semiconductor substrate and the high-concentration impurity region in an area where the gate electrode faces the high-concentration impurity region is controlled according to the strength of a vertical electric field that changes depending on carriers captured by or released from the carrier traps formed in the area. Namely, an information storage function of the memory cell is realized by the tunneling current that drastically changes depending on whether or not the carrier traps are holding the carriers.

In the above arrangement, the amount of the tunneling current controlled by the magnitude of the vertical electric field is influenced by the size of a band gap of the high-concentration impurity region that is facing the gate electrode. To secure a sufficient amount of tunneling current, it is possible to embed a material to the high-concentration impurity region to form a region that has a different band gap, and flow the tunneling current through the region.

The present invention also provides a memory cell comprising a first MOSFET acting as a select transistor and a second MOSFET for storing information. The first and second MOSFETs are connected in series. To store information, an effective channel length of the second MOSFET is reduced. This increases the short channel effect, decreases the threshold voltage, and drastically changes the current-voltage characteristics of the second MOSFET, thereby storing the information in the second MOSFET. A gate insulation film of the second MOSFET includes carrier traps, and depending on whether or not the carrier traps are holding carriers, the current-voltage characteristics of the second MOSFET change drastically.

These and other objects, features and advantages of the present invention will be more apparent from the following detailed description of preferred embodiments in conjunction with the accompanying drawings.

BRIEF DESCRIPTION OF THE DRAWINGS

FIG. 10b is a view showing four cells among the array of FIG. 10a;

FIGS. 16a to 16c are views showing waveforms of writing, erasing and reading operations of the memory cell of FIG. 11b.

DETAILED DESCRIPTION OF THE EMBODIMENTS

Figure 1A:
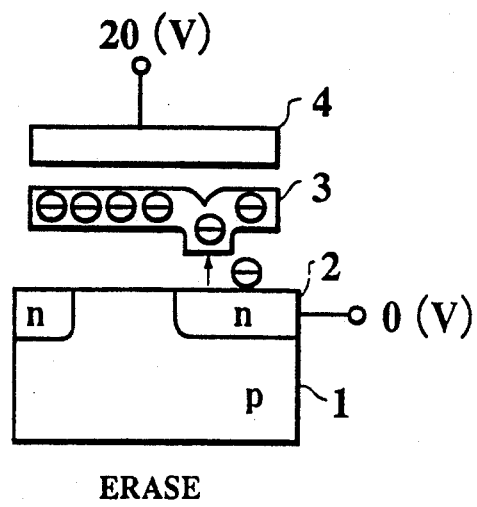
FIGS. 1a and 1b are explanatory views showing an operation of a conventional EEPROM.
Figure 1B:
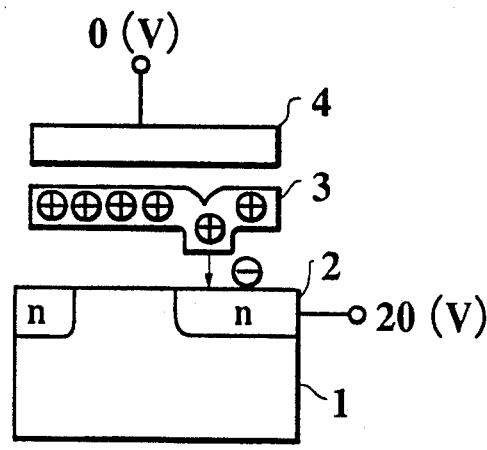
Figure 2:
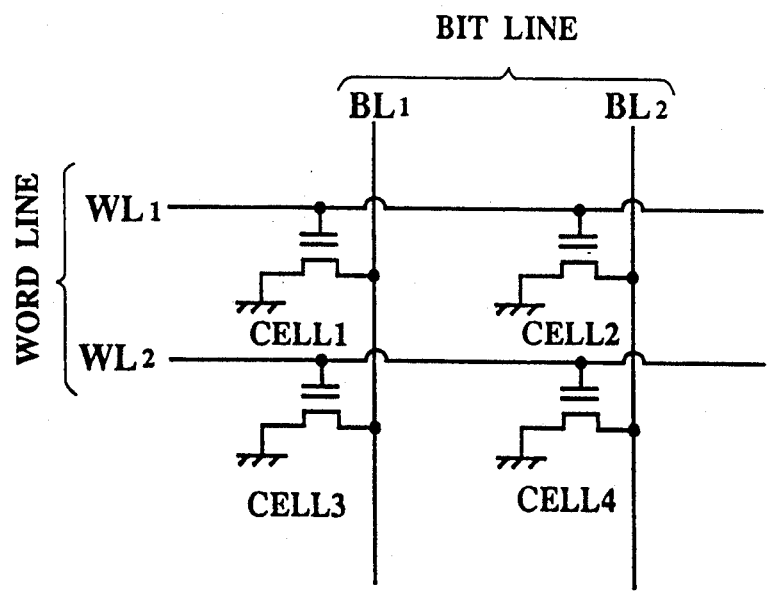
FIG. 2 is a view showing an arrangement of memory cells of the conventional EEPROM.
Figure 3:
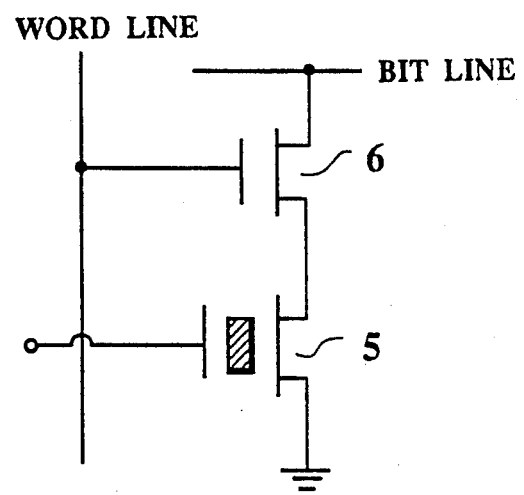
FIG. 3 is a view showing a memory cell of another conventional EEPROM.
Figure 4:
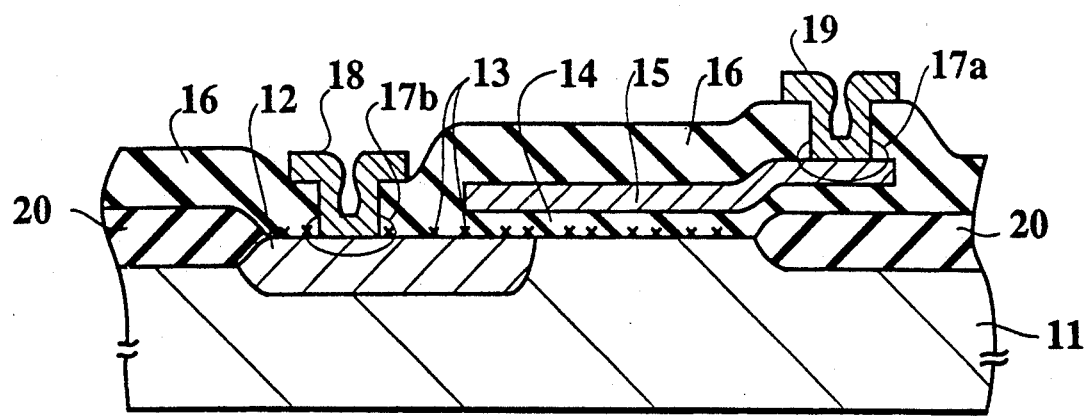
FIG. 4 is a sectional view showing a nonvolatile memory cell according to an embodiment of the present invention.

FIG. 4 is a sectional view showing a nonvolatile memory cell according to the embodiment of the present invention. This embodiment involves a PN junction formed on a semiconductor substrate, and a gate electrode formed at the PN junction to realize a nonvolatile storage function.

In FIG. 4, a silicon semiconductor substrate 11 is of, for example, P type. N-type impurities such as arsenic impurities of $5 \times 10^{18}$ cm$^{-3}$ or more are implanted to the surface of the substrate 11 to form a high-concentration impurity region (a drain region) 12. The drain region 12 and substrate 11 form the PN junction.

A gate insulation film 14 such as a silicon oxide film is formed on the substrate 11. Carrier traps (hole traps) 13 of about $5 \times 10^{12}$ cm$^{-2}$ are formed in the gate insulation film 14. A gate electrode 15 of polycrystalline silicon is formed on the gate insulation film 14. The gate electrode 15 partly faces the drain region 12 across the gate insulation film 14.

An insulation film 16 is formed over the drain region 12 and gate electrode 15. Contact holes 17a and 17b are formed through the insulation film 16, and a drain wire 18 and a gate electrode wire 19 are connected to the drain region 12 and gate electrode 15 through the contact holes 17a and 17b, respectively.

The above arrangement forms one memory cell which is separated from adjacent memory cells by an element separation region 20.

A method of manufacturing the memory cell of FIG. 4 will be explained with reference to FIGS. 5a to 5d.

Figure 5A:
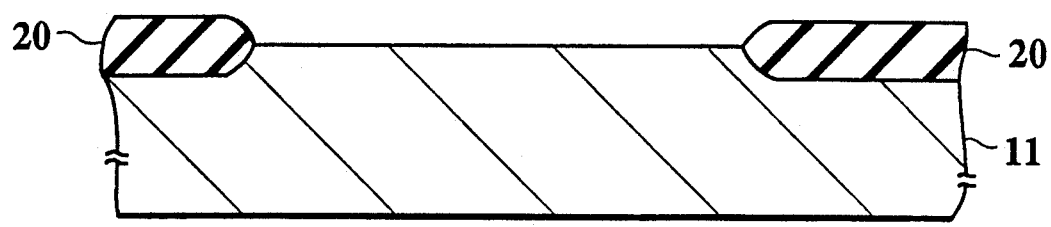
FIGS. 5a to 5d are sectional views showing manufacturing processes of the memory cell of FIG. 4.
Figure 5B:
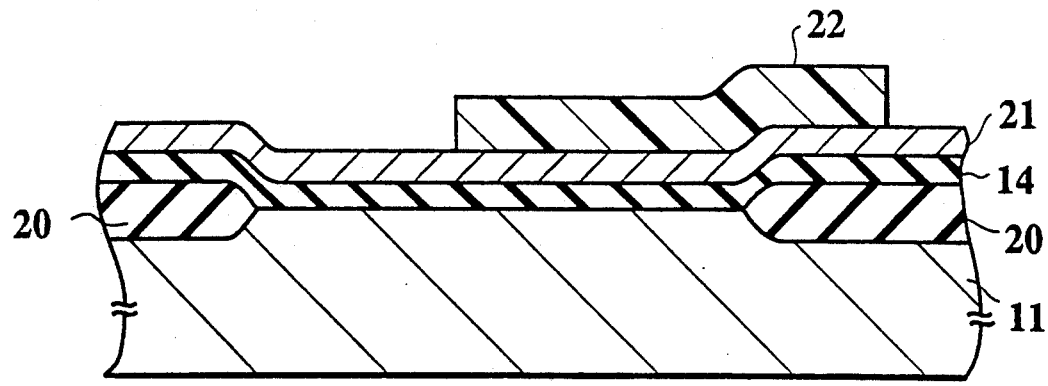

In FIG. 5a, a P-type silicon substrate 11 having impurities of, for example, $1 \times 10^{16}$ cm$^{-3}$ is selectively oxidized to form an element separation region 20 around an area where a memory cell is to be formed.

The surface of the substrate 11 is thermally oxidized at a temperature of about 900 degrees centigrade to form a gate insulation film 14, i.e., a silicon oxide film of about 250 angstroms in thickness. On the gate insulation film 14, a polycrystalline silicon layer 21 is deposited to a thickness of about 3000 angstroms by, for example, a CVD method. The layer 21 will be a gate electrode 15. Phosphorus impurities are implanted and diffused to the polycrystalline silicon layer 21 to about $1 \times 10^{20}$ cm$^{-3}$ in concentration. The layer 21 is then coated with resist. The resist is patterned to a resist pattern 22 of FIG. 5b on a part of the layer 21 where the gate electrode 15 is formed.

Figure 5C:
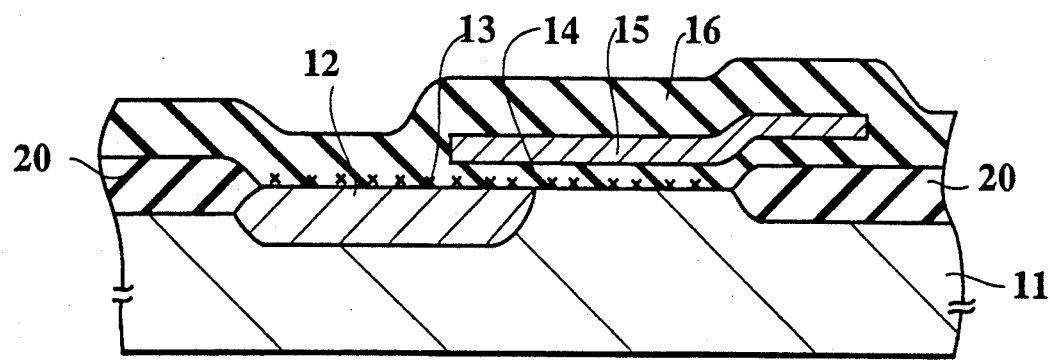

The resist pattern 22 is used as a mask, and the polycrystalline silicon layer 21 is partly etched and removed by, for example, an RIE method, thereby forming the gate electrode 15. The material is then annealed for about 60 minutes in a nitrogen atmosphere at about 1000 degrees centigrade. This forms carrier traps (hole traps) 13 of about $5 \times 10^{12}$ cm$^{-2}$ in the gate insulation film 14. Impurities, such as arsenic of about $1 \times 10^{15}$ cm$^{-2}$ are ion-implanted to the substrate 11 at energy of about 160 keV, thereby forming, in a self-aligning manner, a high-concentration impurity region (a drain region) 12 on the surface of the substrate 11. Thereafter, thermal diffusion is carried out on the material for about 30 minutes at about 900 degrees centigrade. This activates the impurities in the high-concentration impurity region 12, cures damages caused by the ion implantation, and horizontally diffuses the impurities, thereby completing the high-concentration drain region 12. A part of the drain region 12 faces the gate electrode 15 across the gate insulatio film 14. An insulation film 16 is then deposited over the material by, for example, the CVD method to a thickness of about 3000 angstroms, as shown in FIG. 5c.

Figure 5D:
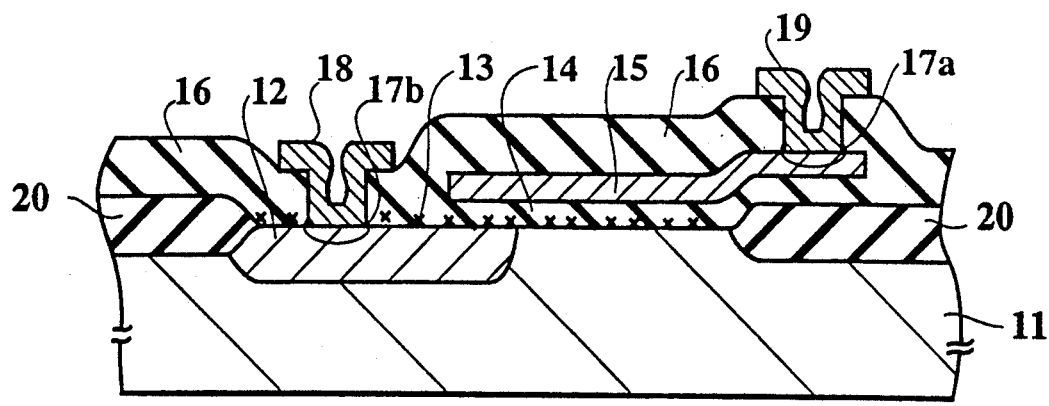

Contact holes 17a and 17b are opened through the insulation film 16 to reach the gate electrode 15 and drain region 12, respectively. A drain wire 18 and a gate electrode wire 19 both made of, for example, aluminum are arranged through the contact holes 17a and 17b, respectively, thereby completing the memory cell as shown in FIG. 5d. This memory cell corresponds to the one shown in FIG. 4.

The operation of the memory cell will be explained.

A current flowing between the substrate 11 and the drain region 12 changes depending on applied bias voltages. The changes in the current are related to binary information, thereby realizing a storage function of the memory cell.

The current flowing between the substrate 11 and the drain region 12 mainly passes an area where the drain region 12 faces the gate electrode 15 with the gate insulation film 14 being between them. This current is a tunneling current generated by electrons that tunnel an interface between the drain region 12 and the gate insulation film 14 from a valence band to a conduction band (inter-band tunneling). This inter-band tunneling current occurs in an overlap area of the high-concentration drain region and gate, and is described in, for example, "IEEE Electron Device Letters" Vol. EDL-8, No. 11, November, 1987, pp. 515 to 517.

The tunneling current is expressed as follows with respect to a vertical electric field produced at the interface between the silicon substrate and the gate insulation film:

$$Id = A \times Ex \times exp(-B/Es)$$

where Id is the tunneling current, A and B constants, and Es is the vertical electric field at the interface between the silicon substrate and the gate insulation film. As is apparent from the above equation, the tunneling current Id drastically changes depending on changes in the vertical electric field Es. According to the present invention, the carrier traps 13 formed in the gate insulation film 14 in the area where the tunneling current occurs and where the drain region 12 faces the gate electrode 15 capture carriers, which then change the vertical electric field.

Figure 6:
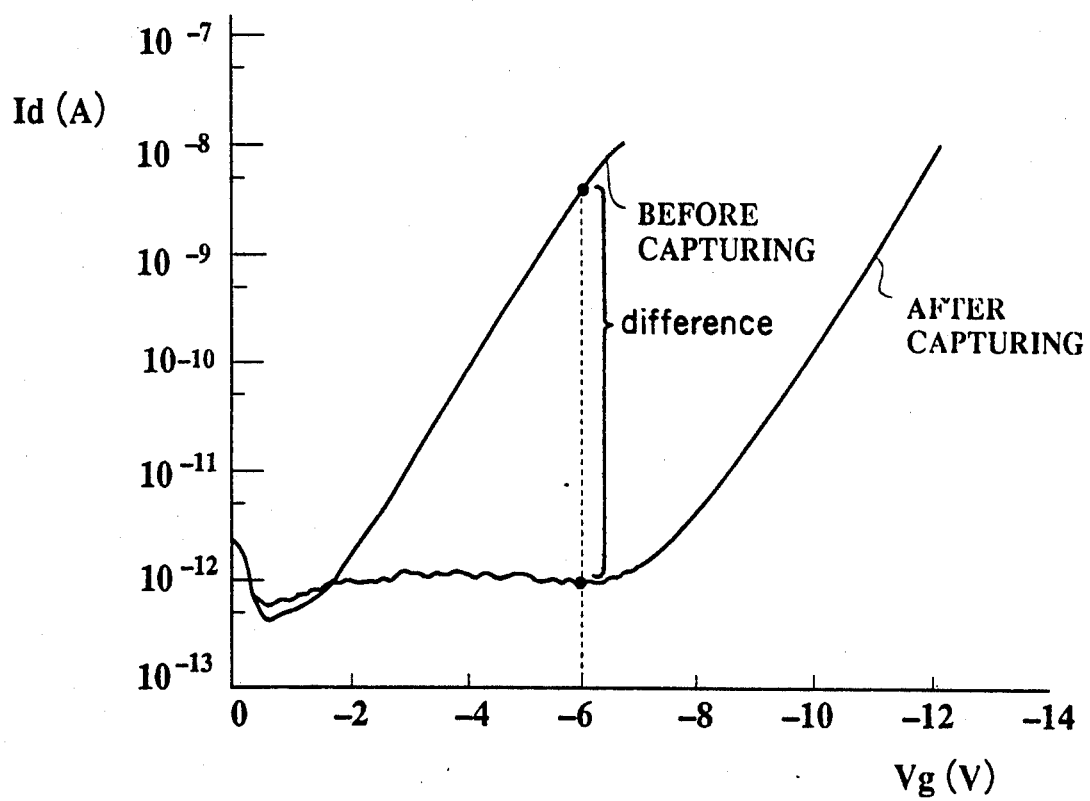
FIG. 6 is a voltage-current characteristic diagram showing the memory cell of FIG. 4.

FIG. 6 is a graph showing relations of an interband tunneling current and a gate voltage of the memory cell formed on the P-type substrate 11, before and after the carrier traps 13 capture carriers.

In FIG. 6, the number of the carrier traps is about $5 \times 10^{12}$ cm$^{-2}$. When a bias voltage of about 0 V is applied to the substrate 11 and a bias voltage of about 2 V to the drain region 12, no carrier is captured by the carrier traps. When a bias voltage of about $-8$ V is applied to the substrate 11 and a bias voltage of about $-20$ V to the gate electrode 15, carriers are captured by the carrier traps 13 in the gate insulation film 14. Measured values of the gate voltage Vg and tunneling current Id of the carrier-not-captured state and carrier-captured state are shown in FIG. 6.

In the area where the drain region 12 faces the gate electrode 15 across the gate insulation film 14, the interband tunneling phenomenon produces electron-hole pairs. Among the pairs, the holes run on the interface between the substrate 11 and the gate insulation film 14 some of them surmount an energy barrier between the silicon substrate 11 and the gate insulation film (silicon oxide film) 14, because the holes receive sufficient energy from an electric field produced by the bias voltages. The holes are captured as captured carriers by the carrier traps 13 in the film 14.

As is apparent from FIG. 6, a value of the gate voltage Vg at which the tunneling current starts to increase shifts by about 6 V before and after the carrier capturing. A value of the tunneling current Id with the gate voltage being about $-6$ V changes by about $10^4$ times before and after the carrier capturing.

In this way, the tunneling current drastically changes in response to the carrier capturing/releasing, i.e., the strength of the vertical electric field in the area where the tunneling current occurs. These changes of the current are related to binary information, thereby realizing the information storing function of the memory cell.

To write the memory cell, a bias voltage of about $-20$ V is applied to the gate electrode 15 and a bias voltage of about $-8$ V to the substrate 11, so that the carrier traps 13 capture carriers. At this time, if the bias voltage is applied to only one of the gate electrode 15 and substrate 11, the carrier traps 13 do not capture carriers. This means that any memory cell can uniquely be selected to write.

To erase the memory cell, the carriers captured by the carrier traps 13 are released to reestablish the carrier-not-captured state. To do so, a positive voltage of about 20 V, for example, is applied to the gate electrode 15.

Figure 7:
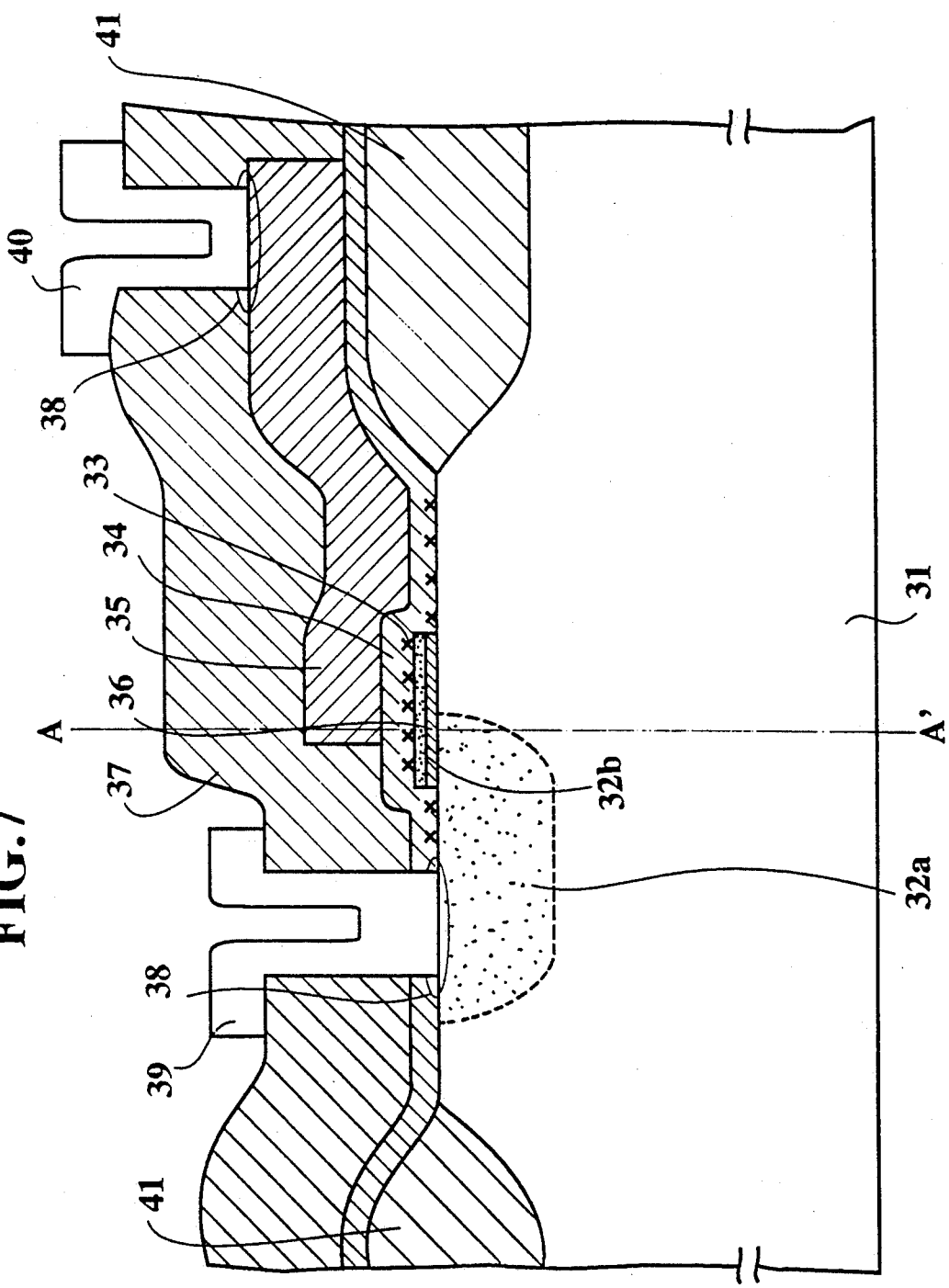
FIG. 7 is a sectional view showing a nonvolatile memory cell involving a material, which has a different band gap from the peripheral area, at a part where a tunneling current flows, according to another embodiment of the present invention.

FIG. 7 shows another embodiment of the present invention.

In FIG. 7, a nonvolatile memory cell comprises a high-concentration region formed in a semiconductor substrate, a PN junction formed between the high-concentration region and the substrate, and a gate electrode. To increase the tunneling current, this embodiment embeds a material in a part of the high-concentration region where the inter-band tunneling occurs to provide the part with a different band gap.

Similar to the embodiment of FIG. 4, the memory cell of FIG. 7 comprises, for example, a P-type silicon semiconductor substrate 31. N-type impurities, such as phosphorus of $5 \times 10^{18}$ cm$^{-3}$ or more, are implanted in the surface of the substrate 31, to form a high-concentration impurity region (a drain region) 32a. The drain region 32a and a well region 31 form a PN junction. A gate insulation film 34 made of, for example, a silicon oxide film is formed on the substrate 31. Carrier traps 33 of about $5 \times 10^{12}$ cm$^{-2}$ are formed in the gate insulation film 34. A gate electrode 35 made of, for example, aluminum is formed on the gate insulation film 34. The drain region 32a and gate electrode 35 partly face each other across the gate insulation film 34.

Material such as mixed crystals of germanium and silicon that provides a different band gap is embedded to an area 36 of the drain region 32a where the interband tunneling occurs. An insulation film 37 is entirely deposited. Contact holes 38 reaching the drain region 32a and gate electrode 35, respectively, are formed through the insulation film 37, and a drain wire 39 and a gate electrode wire 40 are connected to the drain region 32a and gate electrode 35, respectively, through the contact holes 38.

The above arrangement forms one memory cell, which is separated by an element separation region 41 from adjacent memory cells.

Figure 8A:
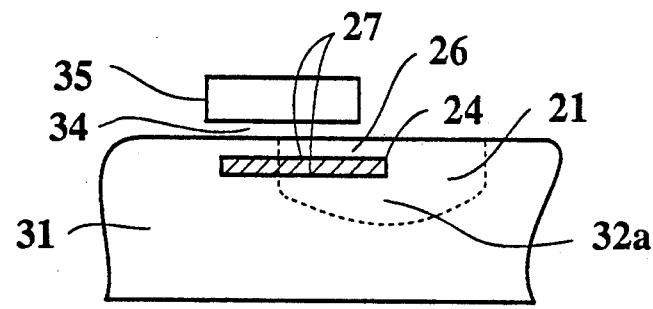
FIG. 8a is a sectional view showing a nonvolatile memory cell.
Figure 8B:
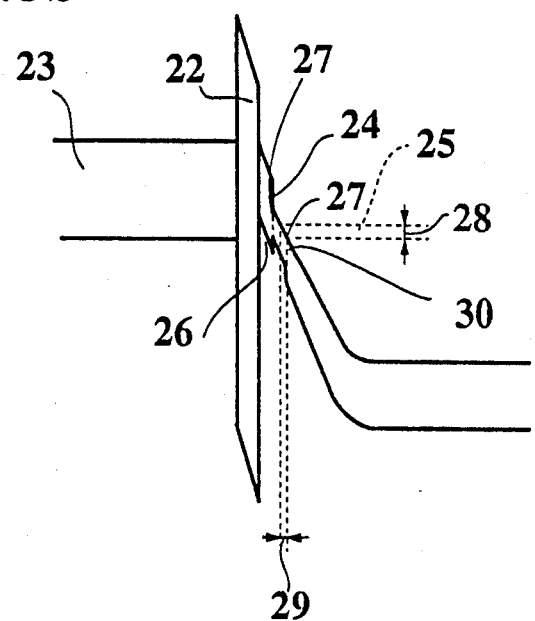
FIGS. 8b and 8c are views showing a band structure along a line A—A' of FIG. 7.
Figure 8C:
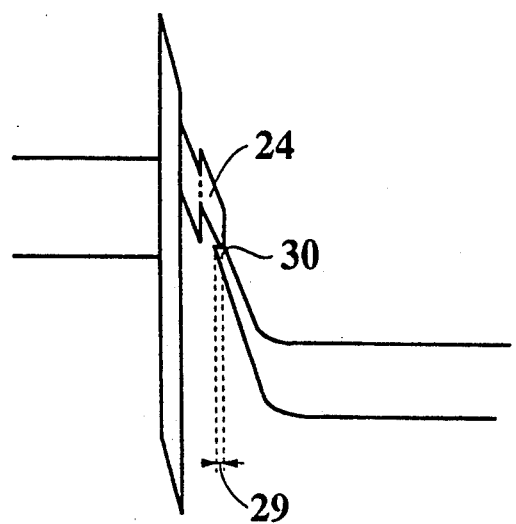

An effect of the area 36 having the different band gap in the structure of FIG. 7 on the tunneling current will be explained with reference to FIGS. 8a to 8c. FIG. 8a is a sectional view showing the structure of FIG. 7, and FIGS. 8b and 8c show bands on a path of the tunneling current.

In an area where the drain region 32a faces the gate electrode 35 across the gate insulation film 34, the gate electrode 35 applies a strong bias to greatly bend a valence band and a conduction band, and electrons tunnel from the valence band to the conduction band. The electrons cause a tunneling current flowing between the substrate 31 and the drain region 32a. Supposing an interface level at a heterojunction can be ignored, the tunneling current can be evaluated as follows:

$$Id = AX\exp(-BV(x) - k^2) \quad (1)$$

where Id is the tunneling current, A and B are constants, V(x) is a potential barrier against electrons in a tunnel path, x0 and x1 are the ends of the potential barrier, and k is a constant determined by the energy of the tunneling electrons.

In the equation (1), the tunneling current Id depends on the height and width of the potential barrier against the tunneling electrons. As the band gap of semiconductor at the tunneling part becomes smaller, the height of the barrier becomes lower and the width thereof narrower. Accordingly, if the tunneling part is made of material that can reduce the integration of the exponential part of the equation (1), the inter-band tunneling current can be increased. If there is an interface level that cannot be ignored, it generates a tunneling current in addition to the one expressed by the equation (1), thereby further increasing the tunneling current. If these conditions are optimized, a sufficient tunneling current is obtainable.

Figure 9A:
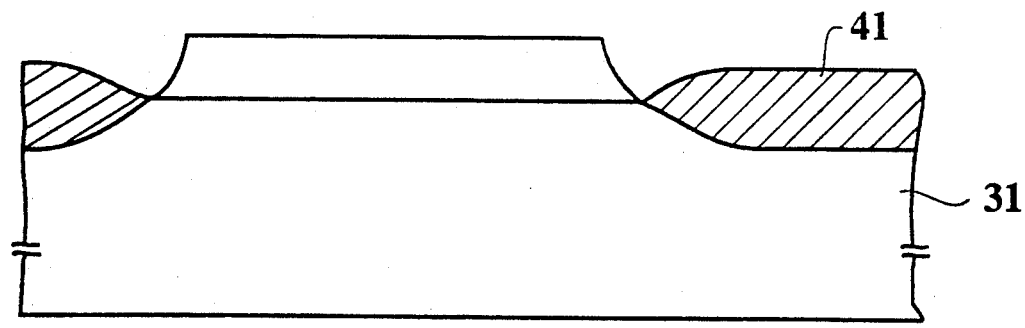
FIGS. 9a to 9c are sectional views showing manufacturing processes of the memory cell of FIG. 7.
Figure 9B:
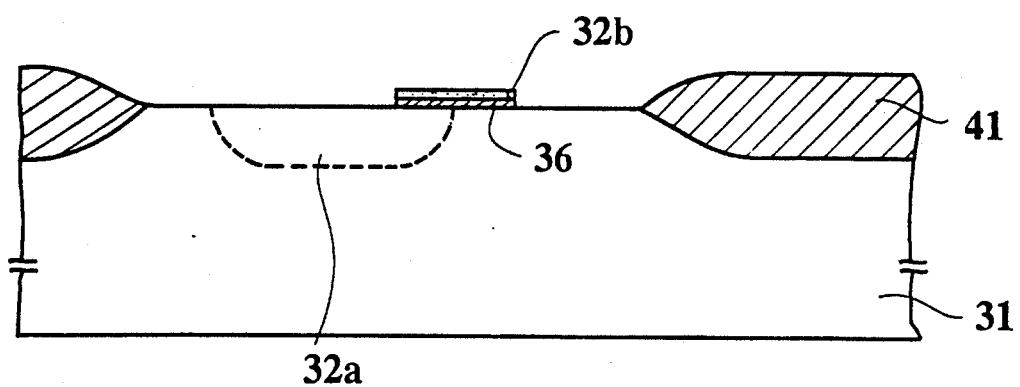
Figure 9C:
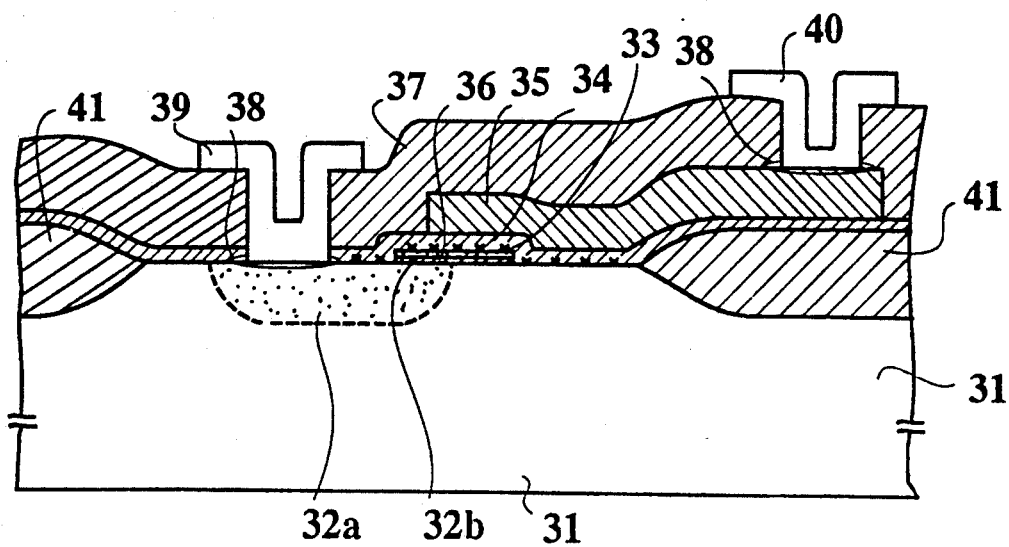

Manufacturing processes of the structure of FIG. 7 will be explained with reference to FIGS. 9a to 9c.

A P-type silicon substrate with impurity concentration of about $1 \times 10^{16}$ cm$^{-3}$ is prepared. A usual selective oxidizing method is used to form an element separation region 41 made of a nitride film around a region where a memory cell is to be formed. (FIG. 9a).

The nitride film on an area where a drain region 32a is to be formed is removed. The remaining nitride film is used as a mask, and, for example, phosphorus of about $1 \times 10^{15}$ cm$^{-2}$ is ion-implanted to the substrate and thermally diffused for about 30 minutes at 900 degrees centigrade, thereby activating the implanted phosphorus. The nitride film is then removed. Hydrogen diluted SiCl$_2$H$_2$, GeH$_4$ and PH$_3$ are used to epitaxially grow, for example, an N-type Si$_{0.69}$Ge$_{0.31}$ mixed crystal layer of, for example, 50 angstroms in thickness under a pressure of 6 torrs at 640 degrees centigrade. Thereafter, an N-type Si layer of, for example, 50 angstroms in thickness is grown at 850 degrees centigrade. An RIE method is employed to remove the epitaxial layers so that the epitaxial layers remain partly on the drain region 32a, thereby forming the drain region 32a having an area 36 that has a different band gap. (FIG. 9b).

A plasma enhanced CVD is employed to form a gate oxide film (a gate insulation film) 34 having carrier traps 33 at 550 degrees centigrade. Aluminum, for example, is deposited by a CVD method, and etched by the RIE method to form a gate electrode 35 that partly faces the drain region 32a. An insulation film 37 is entirely deposited by, for example, the CVD method to a thickness of about 3000 angstroms. Contact holes 38 reaching the gate electrode 39 and drain region 32a, respectively, are formed through the insulation film 37, and a gate electrode wire 39 and a drain wire 40 made of, for example, aluminum are formed through the contact holes 38, thereby completing the memory cell of FIG. 9c.

Figure 10A:
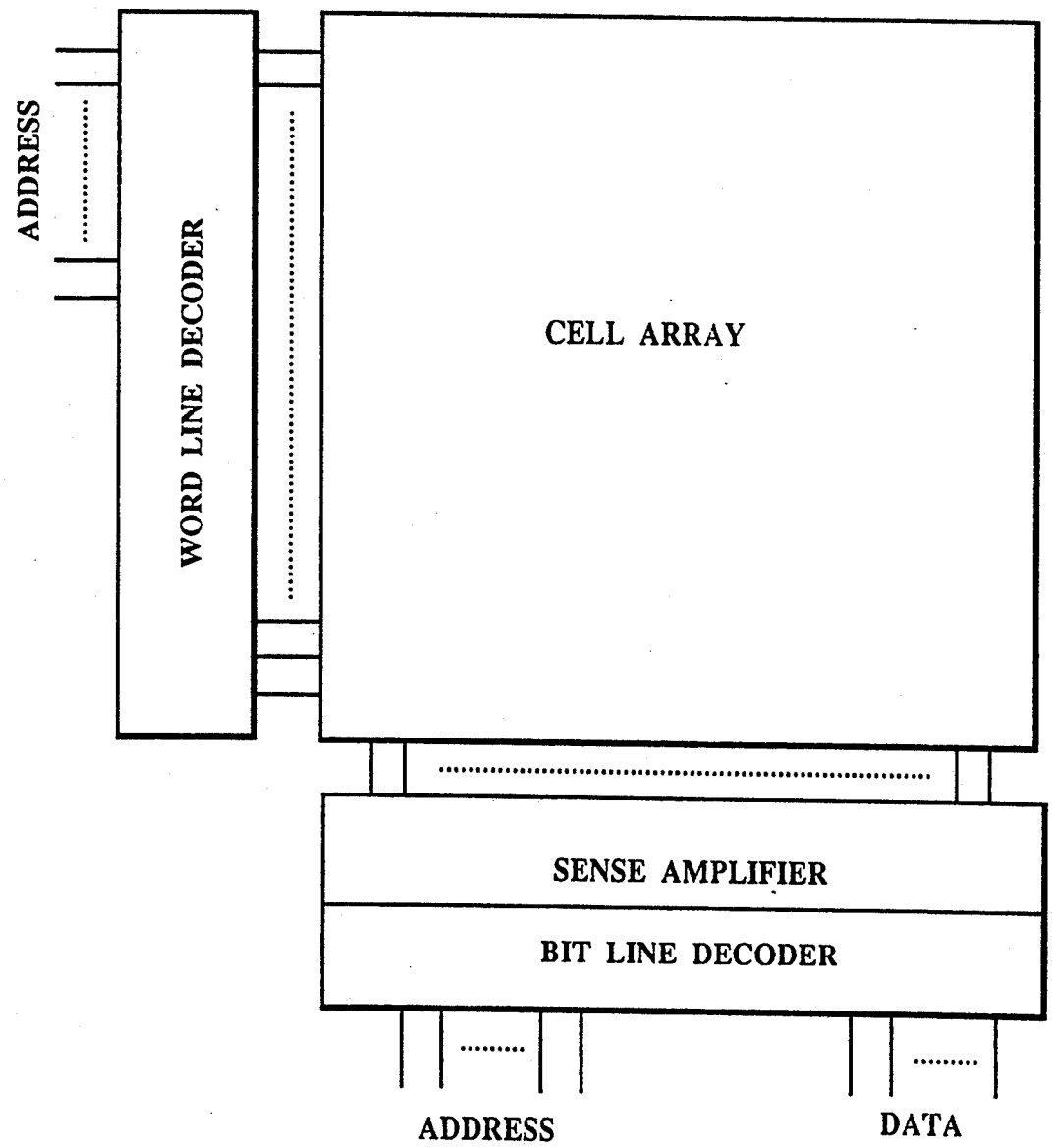
FIG. 10a is a view showing an array of memory cells each of FIGS. 4 or 8.

The memory cells of FIG. 4 or FIG. 7 are arranged in a matrix similar to a usual semiconductor memory, and a word line decoder, sense amplifier, bit line decoder, etc., are arranged to form a memory such as one shown in FIG. 10a.

Figure 10B:
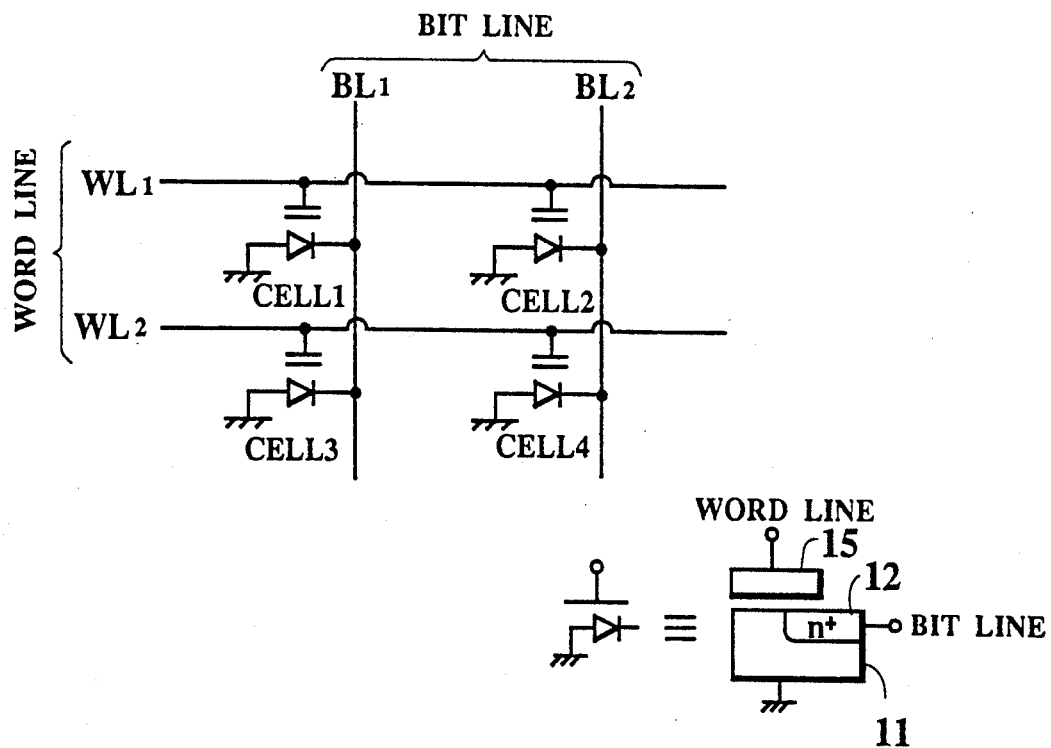

FIG. 10b is a view showing four memory cells of the array of FIG. 10a.

To write a cell 1 of FIG. 10b, a bias voltage of about $-20$ V is applied to a word line WL1 connected to the cell 1 and a bias voltage of about $+8$ V to a bit line BL1 connected to the cell 1. As a result, the carrier traps 13 in the gate insulation film 14 of the cell 1 capture carriers to establish a written state.

Meantime, a bias voltage of about 0 V is applied to a word line WL2 and a bit line BL2, so that no writing or erasing voltage may be applied to other cells 2, 3 and 4. Namely, the cells 2, 3 and 4 are not written or erased, while the cell 1 is uniquely selected among the cells 1 to 4 and written.

To read the cell 1, a bias voltage of about $-6$ V is applied to the word line WL1 and a bias voltage of about $+2$ V to the bit line BL1. Since the cell 1 is holding the carriers, a tunneling current (Id) flowing between the substrate 11 and drain region 12 of the cell 1 will be about $10^{-12}$ A with respect to a gate voltage (Vg) of about $-6$ V, as shown in FIG. 6. This current is read through the bit line BL1. If the cell 1 is holding no carriers, the tunneling current Id will be about $5 \times 10^{-9}$ A with respect to the gate voltage Vg of about $-6$ V. This current is also read through the bit line BL1. By detecting the difference of the current, the information stored in the cell 1 is known.

During the reading operation of the cell 1, a bias voltage of about 0 V is applied to the word line WL2 and bit line BL2, so that only the cell 1 is read.

To erase the cells 1 to 4, a bias voltage of about 20 V is applied to the word line WL1 and WL2 to release carriers captured by the carrier traps 13 in the gate insulation films 14 of the cells 1 to 4.

As explained above, each memory cell according to the embodiment comprises only one high-concentration impurity region and only one gate electrode on a semiconductor substrate. This can provide a very small nonvolatile memory cell capable of being electrically written, read and erased, smaller than a usual MOSFET.

Still another embodiment of the present invention will be explained.

Figure 11A:
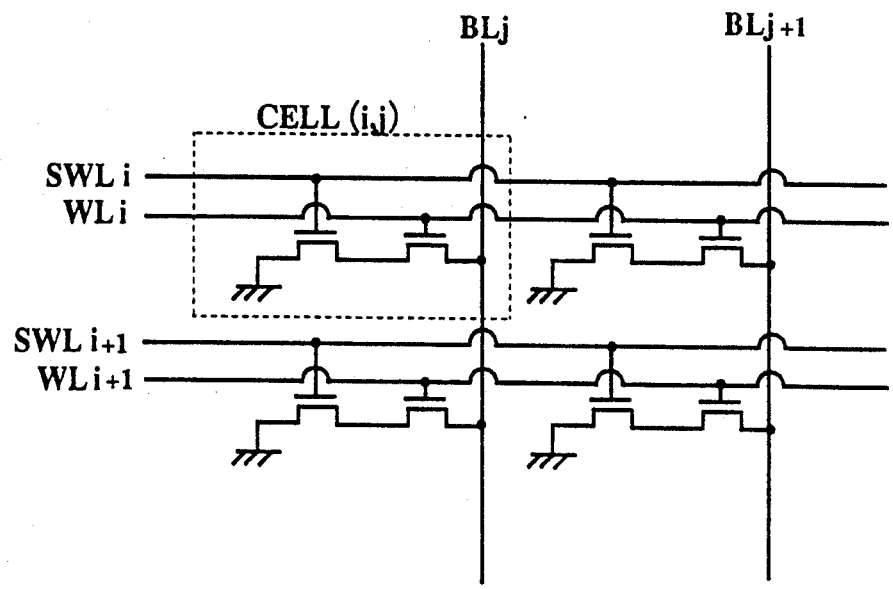
FIGS. 11a and 11b are circuit diagrams showing a nonvolatile memory cell according to still another embodiment of the present invention.
Figure 11B:
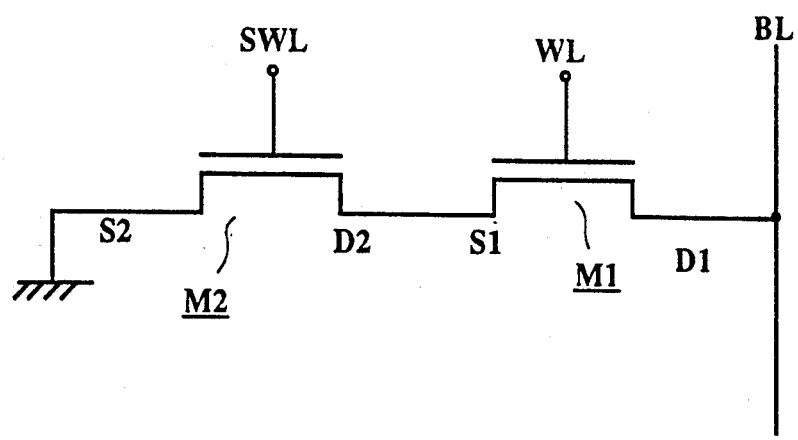

FIGS. 11a and 11b show an array of nonvolatile memory cells arranged in a matrix according to this further embodiment. A memory cell (i, j) comprises a first MOSFET M1 and a second MOSFET M2 connected in series between a bit line BLj and a reference voltage (a ground voltage in this embodiment). A gate electrode of the first MOSFET is connected to a word line WLi, and a gate electrode of the second MOSFET is connected to a second word line SWLi. The first MOSFET M1 is a select gate transistor, and the second MOSFET M2 is an information storage element.

The second MOSFET M2 of FIG. 11b must be a transistor whose threshold voltage can be decreased by changing its effective channel length. This transistor can be realized by controlling basic parameters that determine a structure of the MOSFET. The parameters include a gate oxide film thickness Tox, a substrate concentration Nsub, a junction depth xj of source and drain diffusion layer, etc.

Figure 12:
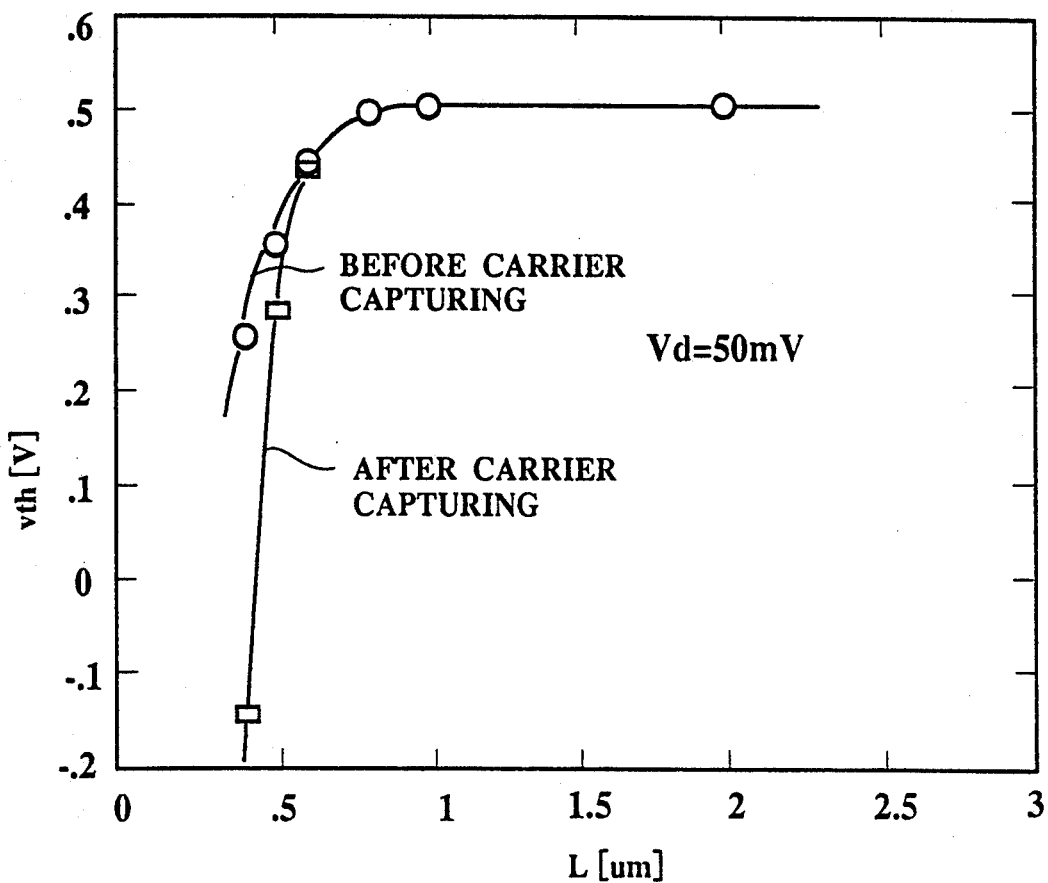
FIG. 12 is a graph showing the dependency of a threshold on a channel length of a MOSFET, with a gate oxide film of the MOSFET capturing or not capturing positive holes.

FIG. 12 is a graph showing the dependency of a threshold voltage on a channel length L of a MOSFET of Tox=25 nm, Nsub=$4 \times 10^{16}$ cm$^{-3}$ and xj=0.2 μm. In the graph, the threshold voltage of the transistor is constant when the channel length is equal to or greater than 0.5 μm. When the channel length is equal to or smaller than 0.4 μm, the threshold voltage rapidly decreases. In addition, the threshold voltage changes before and after capturing carriers. From these facts, the channel length is set to 0.4 μm or the smaller for the above parameters. If the channel length is too short, carriers captured in the oxide film do not sufficiently act on the characteristics of the element. The channel length is, therefore, preferably about 0.4 μm in this embodiment, to provide a sufficient short channel effect.

The second MOSFET is formed based on parameters expressed with the following equation. A minimum channel length Lmin at which the short channel effect is apparent is described in IEEE Electron Device Lett. EDL-1, p. 2 (1980) by J. R. Brews, W. Fiochtener, E. H. Nicollian, and S.Mx Sze, as follows:

$$Lmin = 0.4 \gamma^{\frac{1}{3}}$$

where $\gamma = xj \cdot Tox \cdot 2\epsilon_2 (2Vbi + Vd)/q \cdot NA$ and Vbi is a built-in potential between source/drain and substrate. A channel length of the second MOSFET is set to the above Lmin.

Figure 13:
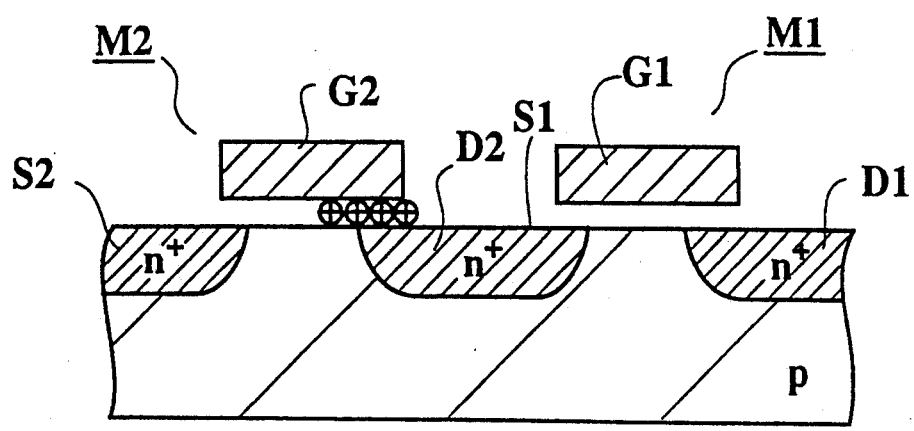
FIG. 13 is a sectional view showing the MOSFETs of the memory cell of FIG. 11b.

A method of writing (storing) information to the memory cell of FIG. 11 will be explained. FIG. 13 is a sectional view of the first MOSFET M1 and second MOSFET M2 of FIG. 11. Here, a film thickness of the gate oxide film of the transistor is, for example, 25 nm, a concentration of the substrate $4 \times 10^{16}$ cm$^{-3}$, and a channel length 0.4 μm. A source S1 of the first MOSFET is common with a drain D2 of the second MOSFET to realize a compact memory cell. To write information to the memory cell, a gate G1 of the first MOSFET M1, i.e., the select transistor of a selected memory cell is turned ON to establish a conductive state. A source S2 of the second MOSFET is grounded, and a negative bias Vg=$-15$ V is applied to a gate G2. At the same time, a voltage of 5 V is applied to the drain D2, thereby generating an inter-band tunneling current in an overlap region of the gate and drain. This generates carriers 130, which are captured in the oxide film. Whether or not the carriers are captured in the oxide film corresponds to information "1" or "0."

The MOSFET incorporating a large number of the carrier traps, for example, about $5 \times 10^{12}$ cm$^{-2}$ is formed as follows:

In usual MOSFET manufacturing processes, a gate oxide film is formed, and a substrate is annealed in a nitrogen atmosphere. For example, the annealing is carried out for 60 minutes at 1000 degrees centigrade in the nitrogen atmosphere. Thereafter, the usual manufacturing processes are employed to form the MOSFET. Through the annealing process carried out after the formation of the gate oxide film, the carrier traps of about $5 \times 10^{12}$ cm$^{-2}$ are formed in the gate oxide film.

Figure 14:
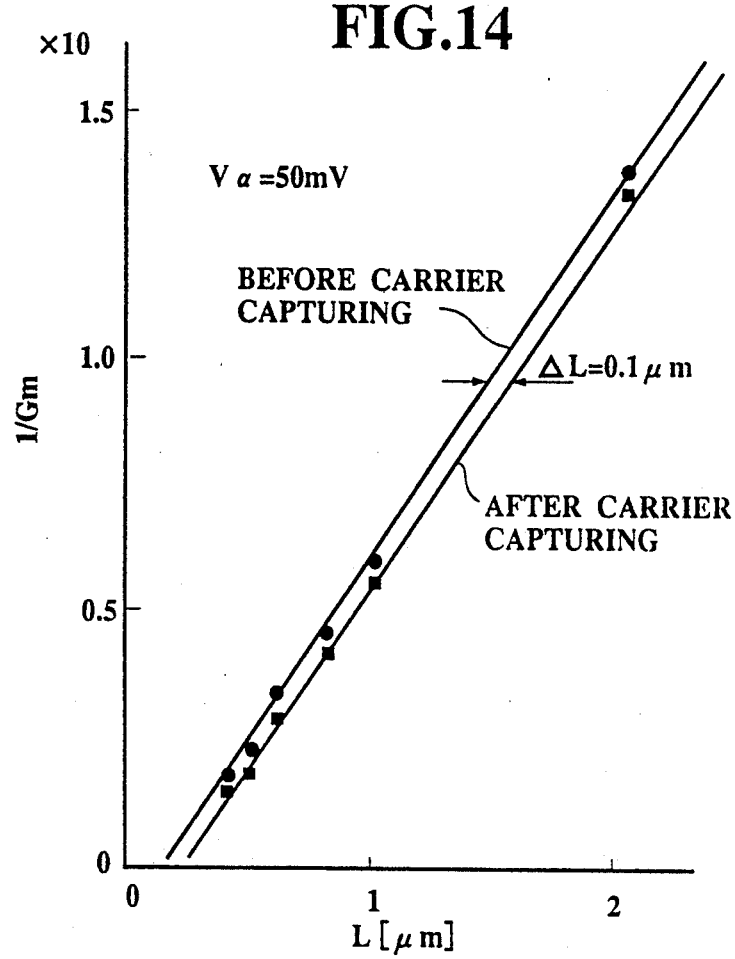
FIG. 14 is a graph showing an inverse of a measured maximum value of transconductance Gm ($\partial Id/\partial Vg$) at a triode region of a MOSFET and a channel length of the MOSFET, with carrier traps of a gate oxide film of the MOSFET capturing or not capturing positive holes.
Figure 15:
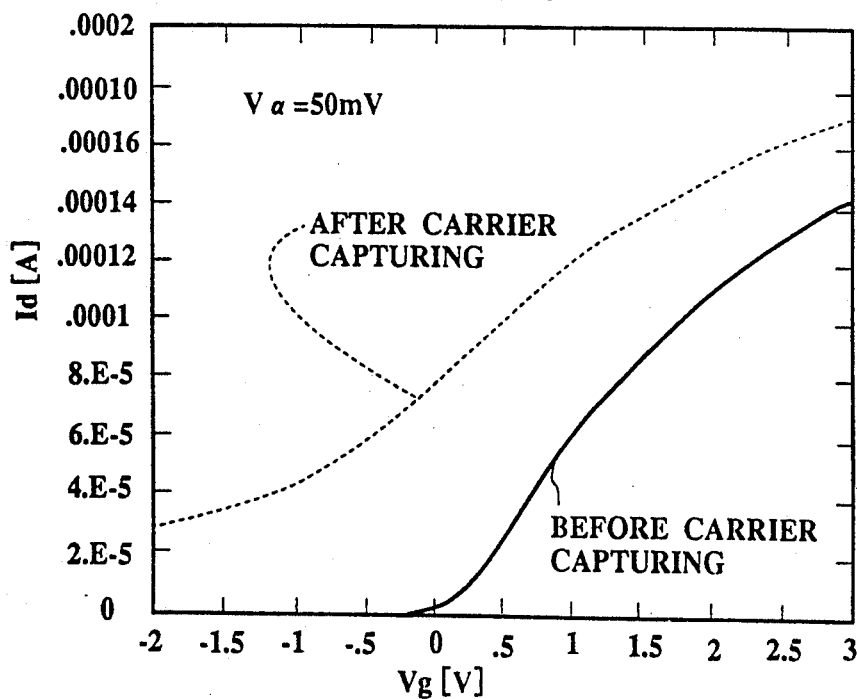
FIG. 15 is a view showing the characteristics of drain current and gate voltage at a triode region of the second MOSFET (M2) of the memory cell of FIG. 11b with a gate oxide film of the MOSFET capturing or not capturing positive holes.

A memory device formed with the above-mentioned MOSFETs can store information with no floating gates. Due to this, manufacturing processes can be simplified. FIGS. 12, 14 and 15 show changes in characteristics of the MOSFET that is produced through the above processes and captures carriers in its oxide film.

FIG. 12 shows the dependency of a threshold voltage on a channel length of the MOSFET in a triode region with the gate insulation film holding carriers. The carriers captured in the gate insulation film cause the short channel effect.

FIG. 14 shows an inverse of a maximum value of transconductance Gm ($\partial Id/\partial Vg$) in the triode region of the MOSFET with the gate insulation film holding or not holding carriers. It is understood that an effective channel length is reduced by 0.1 μm due to the captured carriers.

FIG. 15 shows changes in current-voltage characteristics before and after the oxide film capturing carriers. The captured carriers shorten the effective channel length and decrease a threshold of the MOSFET, thereby increasing a drain current for the same gate voltage. A current driving force differs depending on whether or not the oxide film is capturing carriers. Based on the difference of the current driving force, information of "1" or "0" can be discriminated.

To erase the information stored in MOSFET, a positive bias, for example, 20 V is applied to the gate G2 of FIG. 13, thereby discharging the carriers 130 captured by the carrier traps in the oxide film.

FIGS. 16a to 16c are views showing control signals that are used for writing, erasing and reading data to and from the memory cell of FIG. 11.

FIG. 16a corresponds to a writing operation. When the cell (i, j) of FIG. 11 is to be written, the potential of a corresponding second word line SWLi is changed, for example, from 0 V to 15 V. At substantially the same timing, the potential of a word line WLi of the gate of the first MOSFET is changed, for example, from 0 to 8 V to turn ON the select gate of the first MOSFET M1. Thereafter, the potential of a bit line BLj is changed, for example, from 0 to 5 V. At this time, the second MOSFET M2 whose gate voltage on the second word line SWLi is $-15$ V and drain voltage on the bit line 5 V causes an apparent inter-band tunneling current in a gate-drain overlap region. As a result, carriers are injected into the oxide film and captured by the carrier traps. If the select gate of the first MOSFET is in an OFF state, the corresponding memory cell is in an unselected state. Accordingly, only the second MOSFET M2 of the cell (i, j) can capture carriers in its gate oxide film.

An erasing operation will be explained with reference to FIG. 16b. To discharge the carriers captured in the oxide film of the second MOSFET M2, a zero bias voltage is commonly applied to the source, drain and substrate, and a positive bias voltage of, for example, 20 V is applied to the gate. As shown in FIG. 16b, a potential of the word line WLi is changed, for example, from 0 to 8 V to turn ON the select gate transistor M1. Thereafter, a potential of the second word line SWLi is changed from 0 to 20 V. According to this operation, data of memory cells connected to the second word line SWLi can simultaneously be erased.

A data reading operation will be explained with reference to FIG. 16c. To read data from the cell (i, j), the bit line BLj is precharged to, for example, 5 V. Thereafter, a potential of the second word line SWLi is changed, for example, from 0 to a threshold voltage Vth that is of a transistor not holding carriers. A potential of the word line WLi is changed, for example, from 0 to 8 V. As a result, when the oxide film of the second MOSFET of the cell (i, j) is holding carriers, the potential of the bit line is reduced by a large current. On the other hand, if the second MOSFET of the cell (i, j) is not holding the carriers, the potential of the bit line is decreased a little by a smaller current. Namely, depending on whether or not the gate oxide film of the second MOSFET is holding carriers, a change in the potential of the bit line greatly differs. After a certain period of time, the change in the potential of the bit line is amplified by a sense amplifier to discriminate the contents ("1" or "0") of the memory cell. During this reading operation, the carriers captured in the gate oxide film of the second MOSFET are not released from the carrier traps, so that data can be read non-destructively.

As described above, this embodiment employs only MOSFETs produced through usual MOSFET manufacturing processes, so that the embodiment can provide, at a low cost, a nonvolatile memory cell that is capable of being electrically written, read and erased.

Various modifications will become possible for those skilled in the art after receiving the teachings of the present disclosure without departing from the scope thereof.

What is claimed is:

1. A nonvolatile memory cell comprising:
   (a) a semiconductor substrate of a first conduction type;
   (b) a high-concentration impurity region of a second conduction type formed on said semiconductor substrate of first conduction type and connected to a bit line;
   (c) a gate insulation film formed on said semiconductor substrate;
   (d) carrier traps formed in said gate insulation film;
   (e) a gate electrode formed on said gate insulation film and connected to a word line, at least a part of said gate electrode being opposite said high-concentration impurity region across said gate insulation film and
   (f) means for applying bias voltages to the word and bit lines to control carriers that are captured by and released from said carrier traps formed in said gate insulation film between said high-concentration impurity region and said gate electrode, the nonvolatile memory cell storing information therein, depending on the capture or release of carriers, the information stored in the nonvolatile memory cell being read according to the degree of difference of a tunneling current flowing between said semiconductor substrate and said high-concentration impurity region with and without the capture of carriers.

2. The nonvolatile memory cell as claimed in claim 1, wherein an amount of the tunneling current flowing between said semiconductor substrate and said high-concentration impurity region in an area where said gate electrode faces said high-concentration impurity region across said gate insulation film drastically changes depending on whether or not said carrier traps in said gate insulation film are holding carriers.

3. The nonvolatile memory cell as claimed in claim 2, wherein the first conduction type is P, and the second conduction type is N.

4. The nonvolatile memory cell as claimed in claim 3, wherein said gate insulation film is a silicon oxide film involving carrier traps of about $5 \times 10^{12}$ cm$^{-2}$.

5. The nonvolatile memory cell as claimed in claim 1, wherein a material is deposited in a part of said high-concentration impurity region so that said part may have a different band gap, said part being located in the area where said gate electrode faces said high-concentration impurity region across said gate insulation film and where a tunneling current occurs.

* * * * *